March 12, 1957 J. I. PANKOVE 2,785,095

SEMI-CONDUCTOR DEVICES AND METHODS OF MAKING SAME

Filed April 1, 1953

INVENTOR.
JACQUES I. PANKOVE

BY J. L. Whittaker
ATTORNEY

United States Patent Office 2,785,095

Patented Mar. 12, 1957

2,785,095

SEMI-CONDUCTOR DEVICES AND METHODS OF MAKING SAME

Jacques I. Pankove, Princeton, N. J., assignor to Radio Corporation of America, a corporation of Delaware Application April 1, 1953, Serial No. 346,089

5 Claims. (Cl. 148—1.5)

This invention relates to improved semi-conductor devices and methods for making them, and more particularly to semi-conductor devices having improved reverse current electrical characteristics.

It is well known to make a junction type semi-conductor device by fusing an impurity metal such as indium to a wafer of a semi-conductive material such as N-type germanium to form a P-N rectifying junction. A junction so formed exhibits unilaterial electrical characteristics in that electrical conduction takes place much more readily in one direction across the junction than in the opposite direction. One measure of the effectiveness of a P-N rectifying junction is the electrical conduction through the junction when a varying voltage is applied in the direction of the greatest resistance across the junction. The relationship between the voltage so applied and the current induced thereby is referred to as the reverse curren characteristic.

Generally the reverse current characteristic of a P-N rectifying junction may be illustrated by the curves shown in Figures 1 and 2 of the drawing. The reverse current, $i$, is held to a very low value as the reverse voltage is increased up to a point known as the Zener voltage ($V_Z$) where there is noted a sudden large increase in reverse current. Figure 1 illustrates the type of reverse current characteristic that would theoretically be shown by an ideal P-N rectifying junction. For various reasons not clearly understood, the reverse current characteristic as measured in an actual junction more nearly approximates the curve shown in Figure 2. It is believed that the difference between the two curves is at least partially caused by the non-uniformity of a P-N rectifying junction produced according to present practice.

It is desirable in the production of a P-N rectifying junction in a semi-conductor device to produce a junction having a reverse current characteristic as closely approximating the curve of Figure 1 as possible. It is also desirable to produce a P-N rectifying junction having a Zener voltage as high as possible in order that the use of such a junction may be extended over a wider voltage range.

Accordingly, an object of the invention is to provide an improved semi-conductor device.

Another object is to provide a semi-conductor device having improved electrical characteristics.

Another object is to provide a semi-conductor device having a P-N rectifying junction that exhibits a higher Zener voltage than P-N rectifying junctions hitherto available.

Still another object of the invention is to provide a semi-conductor device having a P-N rectifying junction that exhibits a relatively low reverse current characteristic over a wider voltage range than previous devices.

It has now been discovered that in the production of a semi-conductor device comprising an indium electrode fused to a germanium wafer, the introduction of a small amount of silicon oxide greatly improves the reverse current characteristic of the rectifying junction of the device.

The invention will be more easily understood by reference to the following detailed description and to the drawing of which:

In a preferred embodiment of the invention, a small disc of indium about .005" thick and about .05" in diameter is placed in a vacuum chamber. Within the chamber is also included any well-known means for evaporating silicon oxides. The chamber is evacuated and a relatively small amount of silicon monoxide is evaporated and deposited upon one of the two flat surfaces of the indium disc. The thickness of the deposited coating may be about 1000 to 3000 Angstrom units, although it is not critical. Some silicon dioxide may be present in the deposited coating.

Figure 3:
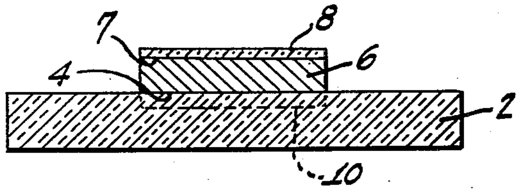
Figures 3 and 4 are schematized, cross-sectional, elevational views of respective devices illustrating different embodiments of the invention.

Referring now to Figure 3, the indium disc 6 having a coating of silicon oxide 8 upon a surface 7 is removed from the vacuum chamber (not shown) and placed upon a wafer 2 of N-type semi-conductive germanium, which may be about 0.25" x 0.1" x .005" in size, in a position such that the uncoated side 4 of the disc is in contact with the germanium. The two bodies are then heated together in an inert or reducing atmosphere at about 500° C. for about ten minutes thus fusing the indium disc to the germanium wafer and forming a P-N rectifying junction 10.

Another embodiment of the invention comprises placing an uncoated indium pellet upon an uncoated germanium semi-conductor, heating the two bodies in contact with each other to cause the indium to wet the germanium and adhere to it, and subsequently evaporating silicon monoxide and depositing it upon the indium and heating again, this time to diffuse the indium into the germanium to form a P-N rectifying junction.

Figure 4:
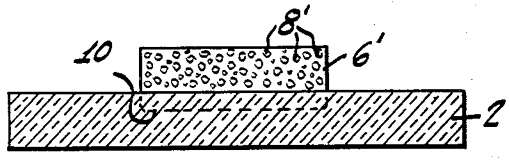

A third embodiment of the invention is illustrated in Figure 4 and comprises producing a P-N rectifying junction 10 by fusing to an N-type semi-conductive germanium wafer 2, a disc 6' of indium into which has been mixed a quantity of powdered silicon monoxide 8 equal to about 1% by weight of the indium disc. The wafer and the disc are heated together in an inert or reducing atmosphere, as in the preceding examples, for about ten minutes at about 500° C. to form a P-N rectifying junction 10 having improved electrical characteristics similar to those of the junctions formed according to the preceding examples.

Figure 1:
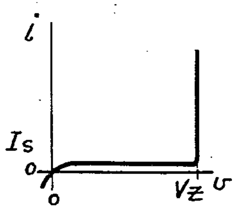
Figure 1 is a curve illustrating the ideal reverse current characteristic of a P-N junction.
Figure 2:
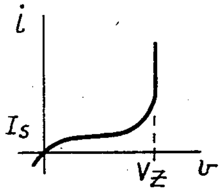
Figure 2 is a curve illustrating the reverse current characteristic of an actual P-N junction produced according to previously known methods.

Devices formed in accordance with the invention comprise P-N rectifying junctions that exhibit reverse current characteristics much more closely approximating the ideal characteristic as illustrated by the curve of Figure 1 than do junctions of devices made in accordance with previous practice. The practice of the invention also produces junctions exhibiting higher Zener voltages than those produced according to previous practice. In particular, in one instance where N-type germanium having a resistivity of about 3 ohm-cm. was used to make a series of P-N rectifying junctions, twelve junctions made according to previous practice exhibited an average Zener voltage of about 69 volts, and 12 junctions made in a similar manner but including the practice of the invention exhibited an average Zener voltage of about 78 volts. It was also noted that the dynamic impedance of the junctions made according to the invention was higher than that of those made according to previous practice.

It is not definitely understood why the practice of the invention provides devices having advantageous characteristics. It appears, however, that some portion of the silicon oxide dissolves in and diffuses through the molten indium during the heating process and enters the junction region. Thus it is not critical how the silicon oxide is introduced, whether by evaporating a thin film on the surface of the indium or by mixing a relatively larger amount into the indium or by any other means.

The term silicon oxide as used in this application refers to either silicon monoxide or a mixture of silicon monoxide and silicon dioxide. It is immaterial whether the silicon is in the monoxide or the mixed oxide form, equally advantageous results being provided by the practice of the invention in either case.

It should be understood that the heating times and temperatures described in the examples are merely illustrative, and that heating to form a P-N recifying junction may be carried out at any temperature within the range of about 400° C. to 800° C. and for a time from about one minute up to several hours. Neither the time nor the temperature used is critical in the production of a junction having improved properties according to the invention.

There have thus been described improved junction type semi-conductor devices and methods for making them, which devices exhibit electrical characteristics of improved uniformity and are operable at higher voltages than such devices hitherto available.

What is claimed is:

1. A method for making a semi-conductor device including a P-N rectifying junction comprising coating a surface of a body of indium with a film of silicon oxide and thereafter fusing said body to a body of N-type semiconductive germanium such that said silicon oxide diffuses through said indium body into said germanium body.

2. A method for making a semi-conductor device including a P-N rectifying junction comprising coating a surface of an indium body with a film of silicon oxide and fusing another surface of said body to a surface of an N-type semi-conductive germanium body such that said silicon oxide diffuses through said indium body into said germanium body.

3. A method for making a semi-conductor device having a P-N rectifying junction comprisnig fusing a body of indium to a surface of an N-type semi-conductive germanium body to cause said indium body to adhere to said surface, evaporating a film of silicon oxide upon said indium body and heating said bodies to cause said indium to diffuse into said germanium body to form a P-N rectifying junction therein.

4. A semi-conductor device comprising a body of N-type germanium, a body of indium mixed with silicon oxide fused to a surface of said germanium body, and a P-N rectifying junction within said germanium body adjacent to said indium-and-silicon oxide body.

5. A semi-conductor device comprising a body of N-type germanium having a second body fused to a surface thereof, said second body comprising silicon oxide and indium.

References Cited in the file of this patent

UNITED STATES PATENTS

| | | |
|---|---|---|
| 2,603,693 | Kircher | July 15, 1952 |
| 2,644,852 | Dunlap | July 7, 1953 |